United States Patent

Sherstinsky et al.

Patent Number: 5,673,922
Date of Patent: Oct. 7, 1997

[54] APPARATUS FOR CENTERING SUBSTRATES ON SUPPORT MEMBERS

[75] Inventors: Semyon Sherstinsky, San Francisco; Alfred Mak, Union City; Leonel Arturo Zuniga, San Jose; Ling Chen, Sunnyvale, all of Calif.

[73] Assignee: Applied Materials, Inc., Santa Clara, Calif.

[21] Appl. No.: 403,141

[22] Filed: Mar. 13, 1995

[51] Int. Cl.[6] .................................................. B25B 11/00
[52] U.S. Cl. .................... 279/133; 118/728; 204/298.15; 279/128; 361/234
[58] Field of Search ................................ 279/128, 133; 361/234; 204/298.15; 118/728, 729; 156/345; 269/8

[56] References Cited

U.S. PATENT DOCUMENTS

| | | | |
|---|---|---|---|
| 4,645,218 | 2/1987 | Ooshio et al. | 279/128 |
| 4,869,801 | 9/1989 | Helms et al. | 204/298.15 |
| 5,213,658 | 5/1993 | Ishida | 156/643 |
| 5,228,501 | 7/1993 | Tepman et al. | 118/728 |
| 5,246,532 | 9/1993 | Ishida | 156/345 |
| 5,298,465 | 3/1994 | Levy | 437/225 |
| 5,330,607 | 7/1994 | Nowicki | 118/728 |
| 5,352,294 | 10/1994 | White et al. | 204/298.15 |
| 5,423,918 | 6/1995 | Gupta et al. | 134/1 |

FOREIGN PATENT DOCUMENTS 362035627  2/1987  Japan ................................ 118/728

OTHER PUBLICATIONS

U.S. Patent Application entitled, "Plasma Reactor with Multi-Section RF Coil and Isolated Conducting Lid," Serial No. 08/277,531, filed Jul. 18, 1994 (AM Docket 609).

*Primary Examiner*—Steven C. Bishop
*Attorney, Agent, or Firm*—Ashok K. Janah; James C. Wilson

[57] ABSTRACT

A semiconductor processing chamber includes a substrate support member on which the substrate is positioned during processing in the chamber. To align the substrate on the substrate support member, an alignment member extends about the perimeter of the substrate receiving portion of the support member. The alignment member includes an alignment face thereon, which urges a substrate into alignment with the substrate receiving face of the support member as the substrate is deposited on the support member. The alignment member may also include a recessed portion, which ensures the presence of a gap between the edge of the substrate and the support member when the substrate contacts the support member.

42 Claims, 6 Drawing Sheets

APPARATUS FOR CENTERING SUBSTRATES ON SUPPORT MEMBERS

BACKGROUND OF THE INVENTION

1. Field of the Invention

The present invention relates to the field of substrate processing apparatus. More particularly, the invention relates to methods and apparatuses useful for properly positioning a semiconductor substrate on a substrate support member within a processing chamber. Additionally, the invention is particularly useful for positioning the substrate in proper alignment with an electrostatic chuck type of support member, wherein the electrostatic chuck grips the substrate in a fixed position, and heat transfer is maintained between the substrate and a substrate support member to maintain the substrate at a specified temperature during the substrate processing operation.

2. Background of the Art

During substrate processing operations wherein a film layer is deposited on the substrate or a film layer previously deposited on the substrate is etched, it is necessary to securely position the substrate in the processing chamber in which the deposition or etching process is performed. Typically, the substrate is positioned on a support member which provides a rigid surface for receipt of the substrate. Additionally, the substrate is also typically chucked to the support member, i.e., firmly attached thereto, to prevent movement of the substrate during processing and to enable heat transfer between the substrate and the support member.

One acceptable means of chucking the substrate to the support member is with an electrostatic chuck. The electrostatic chuck operates by providing an electrostatic charge on its outer surface, which provides an attractive force to pull the substrate against the surface of the chuck and thereby secure the substrate in a fixed position during processing operations.

One typical electrostatic chuck configuration includes a substrate support pedestal on which a thin laminate member is adhered. The thin laminate member includes a thin planar electrode, which is sandwiched between layers of dielectric material. A voltage is maintained on the planar electrode, which creates the electrostatic charge adjacent to the surface of the dielectric layer to grip an object, such as a semiconductor substrate, against the dielectric layer.

Many substrate processing operations require heat transfer between the support member and the substrate. For example, chemical vapor deposition processes typically require that the substrate be heated during processing. Conversely, plasma etch processes typically require that the substrate be cooled during processing. If the substrate is not cooled during etch processing, the temperature of the substrate may exceed the breakdown temperature of film layers deposited thereon, and any semiconductor device formed with the portions of the film layers which have experienced temperatures above the breakdown temperature of the materials therein will be rendered defective.

Where an electrostatic chuck is used as the substrate holder in an etch process, heat transfer from the substrate is accommodated through the laminate member, into the support member, and then into a coolant, such as water, which is passed through the support member. In the typical etch process, the chamber is maintained at a pressure in the milli-torr range or below. Therefore, the conductive and/or convective heat transfer between the substrate and the chuck is limited by the small quantity of gas between the chuck and the substrate. To enhance the heat transfer between the substrate and the support member to a level sufficient to enable the device fabricator to control the substrate temperature, a gas may be ported to the space between the substrate and the laminate member and maintained in that location at a pressure above the chamber pressure. Preferably, the gas is trapped between the substrate and the laminate member, and it provides a medium for convective and/or conductive heat transfer between the substrate and the laminate member.

Where a conventional electrostatic chuck comprised of a conductive core with dielectric outer surfaces is exposed to a plasma etch environment, the dielectric portions of the chuck will be eroded or corroded by the etch environment. Therefore, to protect the electrostatic laminate member, the substrate edge overhangs the edge of the laminate member and thereby masks the dielectric material on the edge of the laminate member from the etch environment. The resulting annular region of the substrate which overhangs the edge of the laminate member cannot be effectively cooled by the gas maintained between the substrate and the laminate member. Thus, any devices which might be formed in this annular region of the substrate will have been exposed to excessive temperatures during the etch process. Therefore, this annular region of the substrate is considered sacrificial, i.e., the fabricator will not form devices in this region, or, any devices formed in this region are considered unrecoverable.

The size of the sacrificial region is primarily a function of the difference between the substrate and laminate member diameters, the fabrication tolerance of these diameters, and the alignment tolerance of the positioning of the substrate on the laminate member. If the substrate could be consistently positioned at the same location on the laminate member, i.e., if the alignment tolerance between the substrate center and the laminate member center was zero, then the size of the sacrificial region would always be the same. However, because the alignment tolerance is not zero, the substrate center is typically offset on the laminate member center during processing. As a result of this offset, the width of the annular region of the substrate which overhangs the laminate member is variable. To ensure that the minimum number of unrecoverable devices are formed on the substrate, the fabricator will consider the width of the annular sacrificial region to be equal to the greatest width possible within the alignment tolerance. While this reduces the number of defective devices formed on the substrate, it also results in a substantial waste of substrate surface area where devices could otherwise be formed.

An additional problem with electrostatic chucks may arise where a "focus ring" is placed about the perimeter of the substrate to enhance the uniformity of the etching of the substrate. If the substrate is substantially misaligned with respect to the substrate receiving surface of the support member, the edge of the substrate may contact the inner surface of the focus ring as it is being positioned. To provide alignment between the substrate and the laminate member when such misalignment occurs, the focus ring may include a taper, i.e., the inner circumferential surface may be frustroconical, such that the focus ring wall tapers inwardly as it approaches the laminate member.

Where the substrate is not perfectly flat, or where the substrate is not parallel to the substrate receiving surface of the electrostatic chuck as it is received on the laminate member, the lowest portion of the substrate may contact the electrostatic chuck while a portion of the substrate is still in contact with the focus ring wall. If this occurs, the electrostatic chuck will grip the portion of the substrate which first comes into contact therewith, which will prevent lateral motion, i.e., motion in the plane of the surface of the laminate member, between the substrate and the laminate member. Therefore, the substrate will become wedged between the laminate member at the initial adhesion point and the focus ring at the point of contact between the substrate and the focus ring. As a result, the portion of the substrate adjacent to the contact point between the substrate and the focus ring will not become adhered to the electrostatic chuck, and when the gas is supplied to the region between the substrate and the support member, a substantial portion thereof will leak from the region between the substrate and the support member. This leakage will cause the portion of the substrate adjacent to the leak to be improperly cooled and, if a sufficient leakage flow is maintained, the leakage gas can be struck into a plasma.

Therefore, there is a need to provide substrate to electrostatic chuck alignment to optimize the number of recoverable devices. Additionally, there is a need to provide the alignment, without substantial risk that the alignment system will cause the substrate to become only substantially adhered to the chuck.

SUMMARY OF THE INVENTION

The present invention provides an alignment member to align the substrate on the support member as the substrate is received on the support member, and to provide this alignment with minimal incidence of simultaneous contact of the substrate with the alignment member and the support member as the substrate is received on the support member. The alignment member provides an alignment mechanism for aligning the substrate with respect to the support member and simultaneously provides a mechanism by which the substrate is spaced from the alignment member as the substrate contacts, or becomes adhered or chucked to, the support member.

In one aspect of the invention, the alignment member is a continuous ring which extends about the periphery of the substrate receiving surface of the support member. In this aspect of the invention, the alignment member includes an inner annular face which interferes with the edge of a misaligned substrate as it is received on the electrostatic chuck and thereby urges the substrate back into alignment with the electrostatic chuck, and a clearance portion located directly adjacent to the surface of the electrostatic chuck which ensures spacing between the edge of the substrate and the surface of the alignment member to ensure that the substrate does not contact the alignment member as it is received on the support member.

In a further aspect of the invention, the continuous ring may be replaced with a plurality of individual posts spaced about the periphery of the electrostatic chuck, each of which provide the alignment between the substrate and the laminate member, and each of which also ensure the presence of a gap between the posts and the substrate as the substrate contacts the laminate member.

The alignment member may be used to align substrates for receipt on support members used in both deposition and etch processes. Additionally, the alignment member is particularly useful where the chucking member is an electrostatic chuck, because the alignment member aligns the substrate to the laminate member and ensures that the substrate edge will not be in contact with the alignment member when the substrate first contacts the laminate member. Additionally, the alignment member substantially reduces the alignment tolerance between the substrate handling member and the electrostatic chuck, thereby reducing the size of the sacrificial region and increasing the yield of devices from the substrate.

DESCRIPTION OF THE EMBODIMENTS

The present invention is an alignment member for aligning a substrate on a support member as the substrate is received on the support member. The invention provides alignment between the substrate and the support member, but is configured to ensure that the substrate will not simultaneously contact both the substrate receiving surface of the support member and the alignment member.

Where the alignment member is used in conjunction with an electrostatic chuck, the configuration of the alignment member ensures alignment between the substrate and the laminate portion of the electrostatic chuck to minimize the sacrificial region of the substrate which overhangs the laminate member, and it also ensures that the substrate will not simultaneously contact both the alignment member and the laminate portion and thereby eliminates the incidence or partial contacting of the substrate with the laminate member, i.e., cocking or jamming. Additionally, the alignment member may be used as a replacement for a traditional focus ring which may be used in the etch process.

Figure 1:
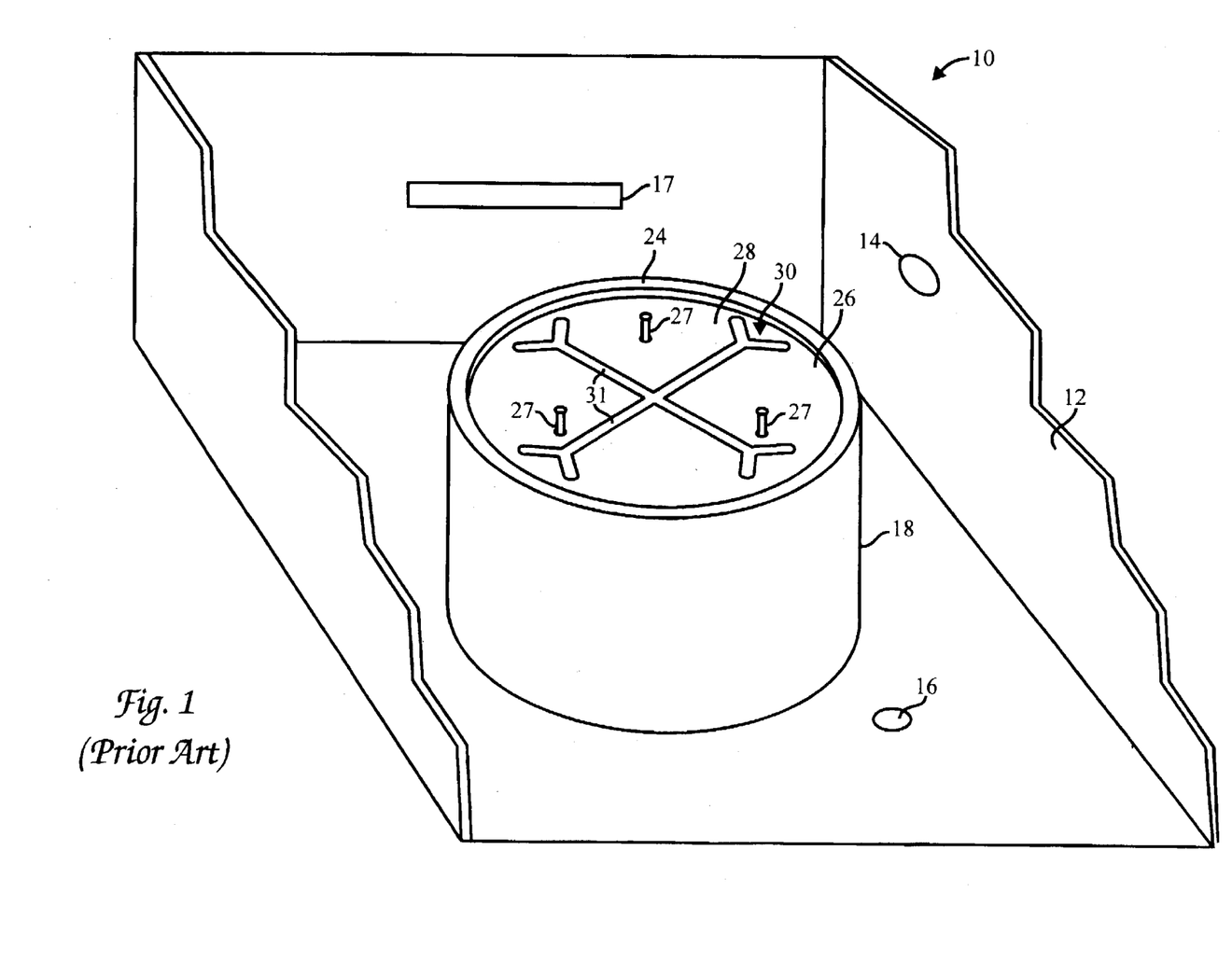
FIG. 1 is a perspective view of a prior art substrate support member, electrostatic chuck and focus ring combination.

Referring to FIG. 1 there is shown, in partial cutaway, a prior art substrate etch chamber within which the present invention may be used to advantage. The chamber 10 generally includes an enclosure wall 12, having at least one gas inlet 14 and a vacuum port 16 ported to a vacuum pump (not shown), a slit valve 17 for placing substrates in, and removing substrates from, the chamber 10 and a substrate support member 18. A laminate member 26 is received over the substrate receiving portion 28 of the support member 18 to form an electrostatic chuck 30. The support member is coupled to a substrate positioning device, in the illustrated embodiment a plurality of pins 27 extendable through the support member and positionable with respect to the substrate receiving surface 28 thereof. A focus ring 24 extends about the periphery of the substrate receiving surface 28 to form a shield about the edge of the substrate 8 (not shown in FIG. 1).

Figure 2:
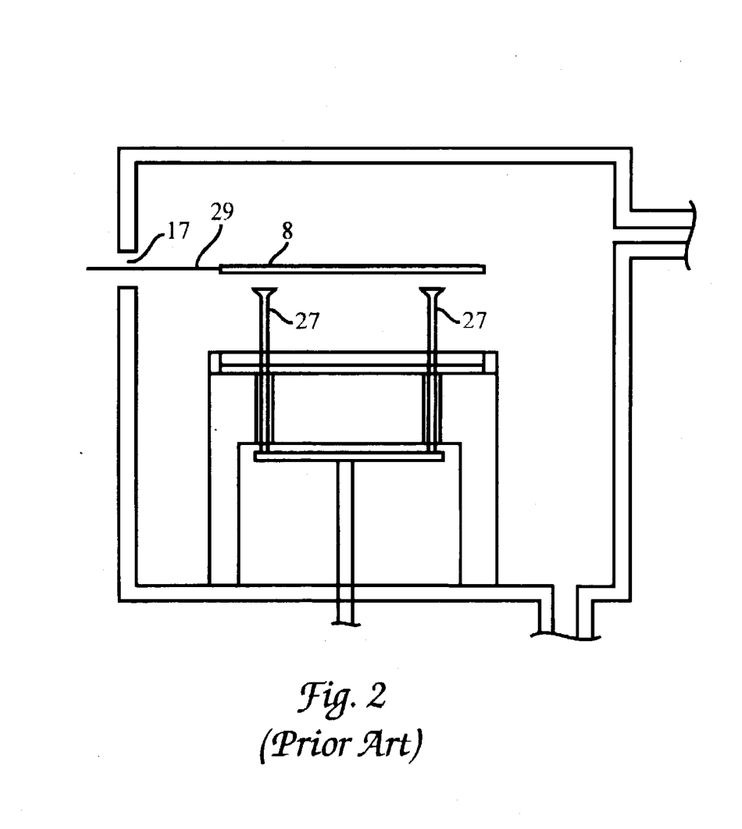
FIG. 2 is a sectional view of the apparatus of FIG. 1, showing the substrate positioned for receipt on the support member.
Figure 3:
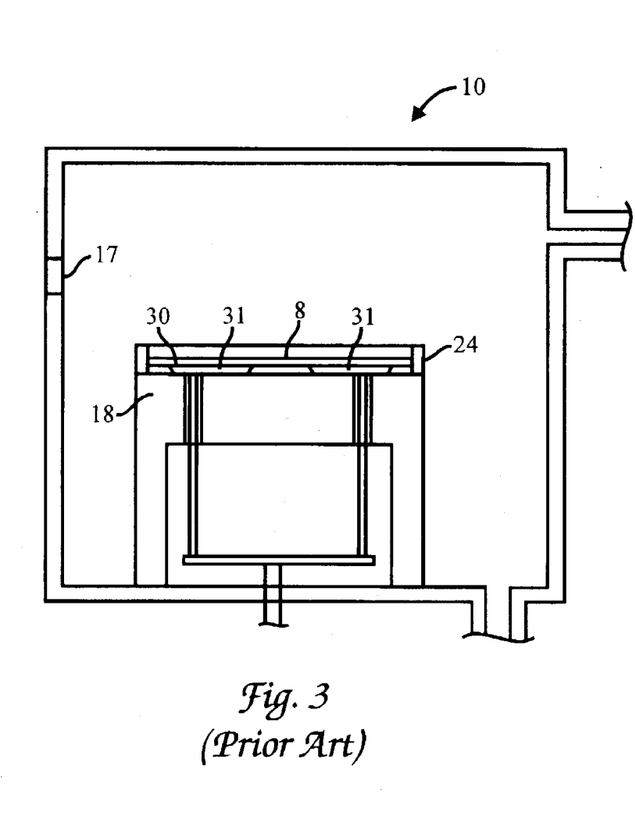
FIG. 3 is a sectional view of the apparatus of FIG. 1, showing the substrate received on the support member.

Referring now to FIGS. 2 and 3, to position the substrate 8 on the support member 18, a robot blade 29 extendable through the slit valve 17 positions the substrate above the support member 18.

The pins 27 then move upwardly to lift the substrate 8 off the blade 29, the blade 29 is removed from the chamber 10, and the pins 27 then retract into the support member 18 to position the substrate 8 on the substrate receiving surface 28 of the support member 18 as shown in FIG. 3.

Figure 4:
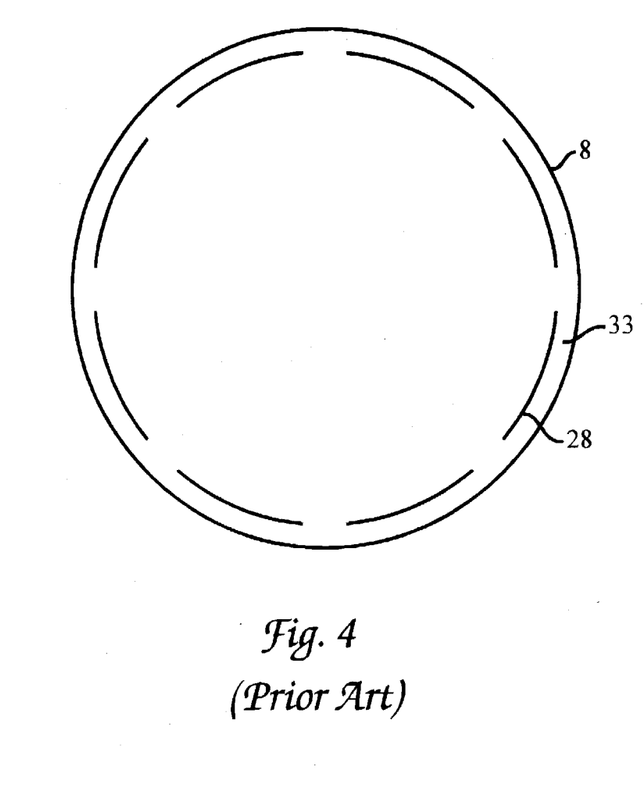
FIG. 4 is a plan view of a substrate received on the laminate member.

Once the substrate 8 is positioned on the electrostatic chuck 30 as shown in FIGS. 3 and 4, a gas is provided to a plurality of channels 31 (best shown in FIG. 1) in the chuck 30 to provide enhanced heat transfer between the substrate 8 and the support member 18. The support member 18 is cooled, typically by flowing chilled water, or other coolant, through channels (not shown) provided in the support member for that purpose.

If the substrate 8 is properly aligned as it is deposited on the electrostatic chuck 30, (the outer perimeter of which is shown as dashed lines in FIG. 4) an annular portion 33 of the substrate 8 will overhang the edge of the laminate portion 28. This annular portion 33 of the substrate 8 protects the edge of the laminate portion 28 from the corrosive and/or erosive affects of the process environment, and this portion of the substrate 8 therefore provides the sacrificial region which is not cooled by the gas and thus, by design, does not yield recoverable integrated circuit devices.

Figure 4A:
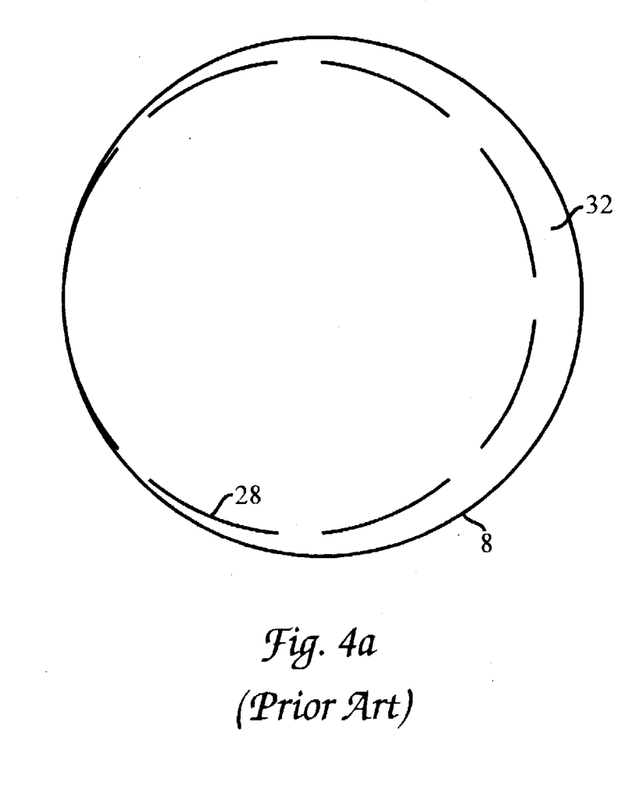
FIG. 4a is an additional plan view of a substrate received on the laminate member.

If the substrate 8 is misaligned on the electrostatic chuck 30, the annular portion 33 will not be symmetrical. Instead, the diameter or width of the annular portion 33 will vary around the circumference of the substrate 8. At the most extreme misalignment condition between the substrate and the chuck 30 as shown in FIG. 4a, the edge of the substrate 8 will be vertically aligned with the edge of the laminate portion 28 at one position, and a crescent shaped portion 32 of the substrate 8 will overhang the edge of the laminate member at a position 180 degrees from the vertically aligned location of the chuck 30 and substrate 8. This crescent shaped portion 32 will be twice as wide as the nominal width of the nominal sacrificial annular region 33 shown in FIG. 4, and it may include portions of the substrate 8 which are intended for the creation of recoverable devices. In the prior art, this crescent shaped region is tolerated either by producing devices in the region which are defective or by increasing the width of the annular region 33 to ensure that in the most extreme case of misalignment, i.e., that shown in FIG. 4a, the entire crescent shaped region 32 is within an enlarged annular region 33 (The inner perimeter of which is shown in dashed lines). However, no matter how the misalignment is addressed, the number of devices recoverable from the substrate 8 is reduced vis-a-vis the number which would be recoverable if the substrate was perfectly aligned on the laminate portion 28 and the tolerance on that alignment was significantly increased or eliminated.

In the conventional chamber shown in FIGS. 1 to 3, the robot blade, in conjunction with the pins 27, provides the alignment between the substrate 8 and the laminate portion 28 of the electrostatic chuck 30. If the substrate 8 is misaligned on the robot, or if the robot indexing, i.e., the means for locating the substrate 8 on the robot with the pins 27, is defective, the substrate 8 will be misaligned when received on the laminate portion 28 and the crescent-shaped region 32 will result. Additionally, if the means for lifting and lowering the pins 27 is misaligned, or if the pins 27 have different lengths, the substrate 8 may slide laterally on the pins 27 by a slight distance, and thereby become misaligned when received on the laminate portion 28. Finally, the pins 27 may vibrate or shake, which may cause the substrate 8 to move on the pins 27 as it is lowered onto the electrostatic chuck 30.

Referring now to FIGS. 5 through 8, there is shown the receipt of a substrate 8 on the support member 18, wherein the preferred embodiment of the alignment apparatus 50 is used to align a misaligned substrate 8 on the laminate portion 28 of the electrostatic chuck 30. In the illustration of the embodiment, the substrate edge is shown at an angle which occurs where the substrate is bowed, or where the pins 27 are of different heights. In this preferred embodiment, the alignment apparatus is an annular member, preferably configured from quartz or another insulative material and positioned on the support member 18 about the perimeter of the laminate member 28, having a planar base 52, a planer upper surface 54, an outer cylindrical face 56 and an inner cylindrical surface 58. Uniquely, the inner cylindrical surface 58 includes an tapered alignment portion 60 extending radially inwardly from the upper surface 54, and a tapered clearance portion 62 extending radially inwardly from the planar base 52. The alignment portion 60 and the clearance portion 62 intersect approximately midway between the base 52 and the upper surface 54 in a circular alignment ridge 64. The alignment ridge 64 is positioned, with respect to the edge of the laminate portion 28, to ensure that the edge of the substrate 8 is aligned with the edge of the laminate portion 28 to create an overhanging portion of the substrate 8 having a relatively uniform annular width. Additionally, the alignment ridge 64 creates a circular restriction, which is aligned with the laminate portion 28 to provide the alignment of the substrate 8 on the chuck 30, and it is sized to have a diameter slightly greater than the maximum diameter of the substrate 8.

Figure 5:
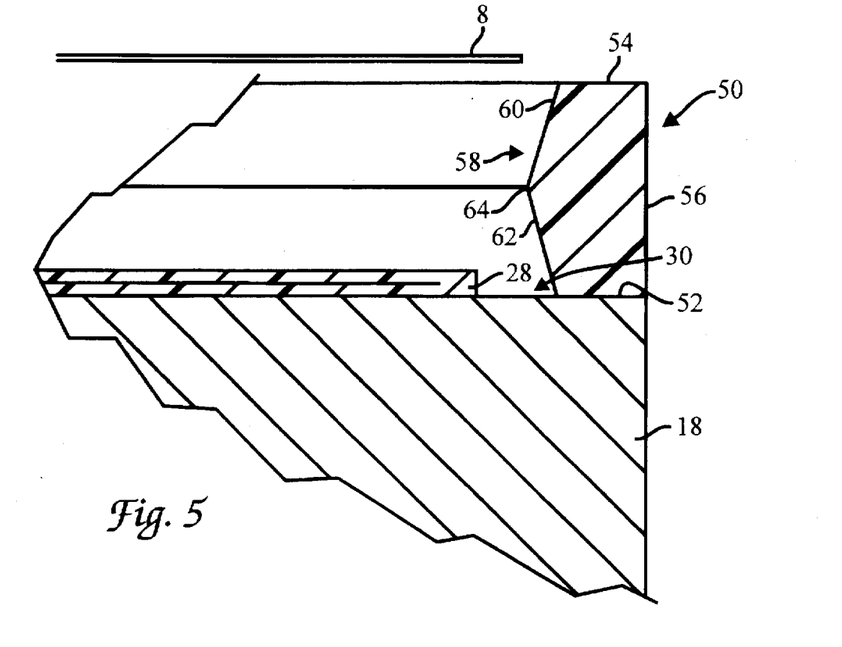
FIG. 5 is a partial sectional view of the apparatus of FIG. 1, showing one embodiment of the alignment apparatus located on the support member.

To enable centering of a substrate 8 on the electrostatic chuck 30, the alignment apparatus 50 is positioned on the substrate support member about the perimeter of the laminate portion 28 as shown in FIG. 5. The alignment member 50 may simply be placed on the surface of the support member 18, it may be bolted or otherwise attached thereto, or it may rest on, or be attached to, an intermediate member which is, in turn, connected to the support member. A substrate 8 is positioned above the support member 18, as shown in FIG. 5, preferably by positioning the substrate 8 on the plurality of pins 27, which are extendable from the support member as better shown in FIGS. 2 and 3.

Figure 6:
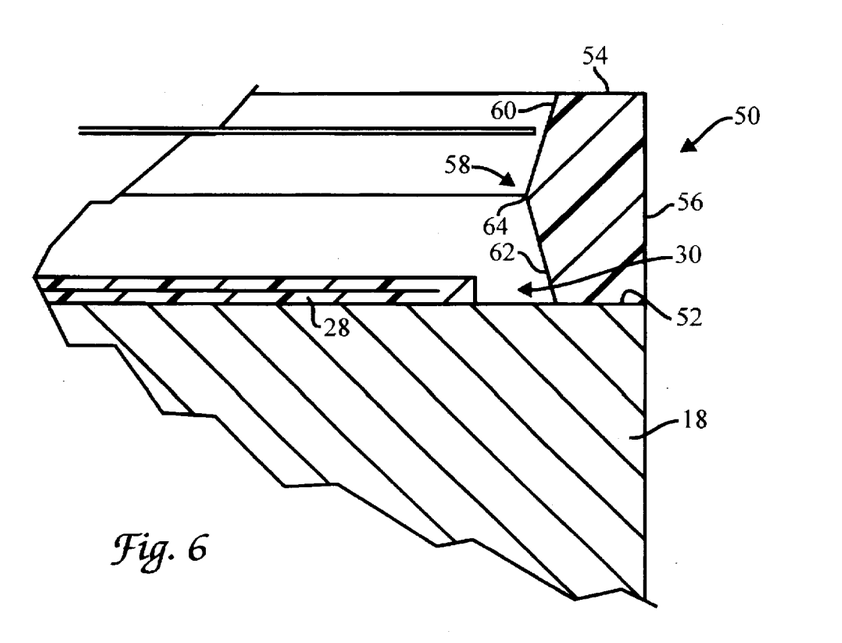
FIG. 6 is a partial sectional view of the apparatus of FIG. 5, showing the substrate in contact with the alignment portion.
Figure 7:
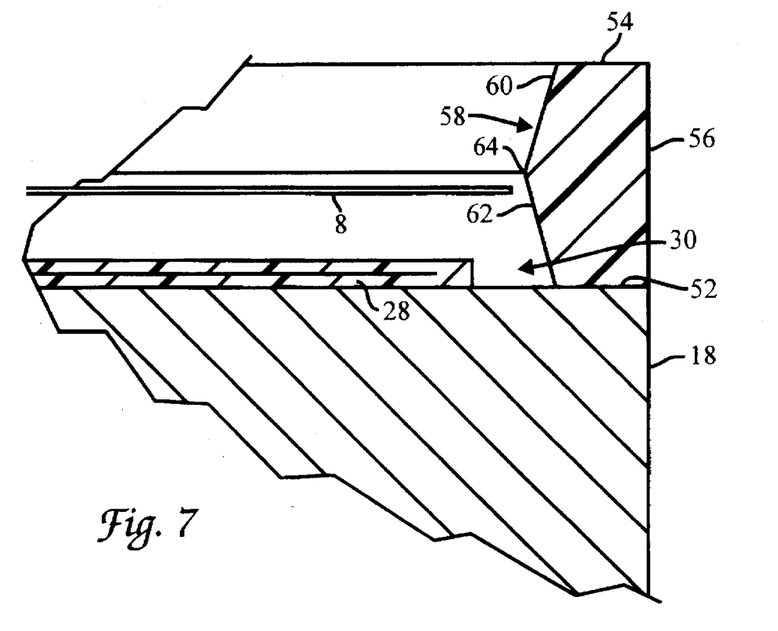
FIG. 7 is a partial sectional view of the apparatus FIG. 5, showing the substrate aligned with the laminate member after passing through the alignment member.
Figure 8:
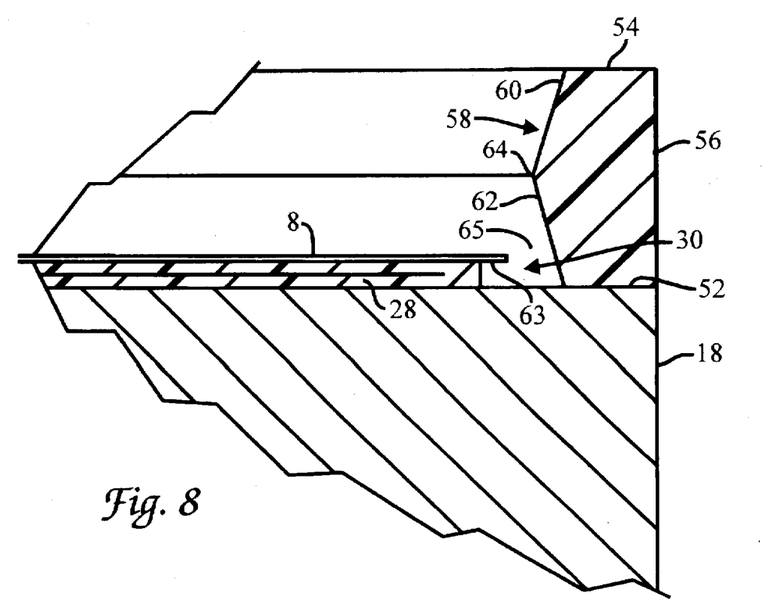
FIG. 8 is a partial sectional view of the apparatus of FIG. 5, showing the substrate received, and centered on, the laminate member.

Once the substrate 8 is positioned on the pins 27, it is lowered onto the laminate portion 28 as shown in FIGS. 6 to 8. If the substrate 8 is misaligned with respect to the laminate portion 28, the substrate edge will contact the alignment portion 60, as shown in FIG. 6, as the substrate 8 approaches the support member 18. Because the alignment apparatus 50 is fixed with respect to the support member 18, further movement of the substrate 8 in the direction of the support member 18 will cause the substrate 8 to move radially inwardly to a radially centered position on the laminate portion 28 as it slides along the alignment portion 60, to become centered on the laminate portion 28 of the electrostatic chuck 30. The substrate 8, when misaligned, will continue to move radially inwardly as it is lowered onto the support member 18 until it passes the circular alignment ridge 64 of the alignment member 50 (as shown in FIG. 7). Once the substrate 8 has moved below the alignment ridge 64, the substrate edge is located adjacent to the clearance portion 62 of the alignment apparatus 50. In this position, the edge of the substrate 8 no longer contacts the alignment member 50, because the clearance portion 62 provides a gap 65 (FIG. 8) between the substrate edge and the alignment member 50. Therefore, once the substrate 8 is aligned with the laminate portion 28 by the alignment ridge 64, the substrate edge no longer contacts the alignment member 50, and the receipt of the substrate 8 on the laminate portion 28 is performed without simultaneous contact between the substrate 8 and the alignment member 50 (as shown in FIG. 8) and with a substantially uniform width overhanging portion 63 of the substrate 8 over the outer edge of the laminate portion 28.

In the preferred embodiment of the invention, as shown in FIGS. 5 through 8, the alignment portion 60 is a frustroconical surface which extends downwardly, and radially inwardly, from the upper surface 54 of the alignment member 50 to the alignment ridge 64, and the clearance portion 62 is a frustroconical surface which extends downwardly, and radially outwardly, from the alignment ridge 64 to the base 56 of the alignment member 50. Thus, the frustroconical surface comprising the alignment portion 60 is inwardly tapered, i.e., it decreases in diameter as the distance from the upper surface 54 to a point on the alignment portion 60 increases. Likewise, the frustroconical surface comprising the clearance portion 62 is outwardly tapered, i.e., it increases in diameter as the distance from the alignment ridge 64 to a point on the clearance portion 62 increases. The alignment ridge preferably has minimal height, i.e., it is formed from the intersection of the frustroconical faces of the alignment portion 60 and the clearance portion 62. However, if desired, the alignment ridge may have a height, whereby the alignment ridge is formed as a circumferential face.

The clearance portion 62 is configured as a frustroconical surface to ensure that in the event a substrate 8 becomes misaligned after passing below the alignment ridge 64, the substrate will not become trapped in the alignment member 50, because, in the event of such misalignment, the continuous inward taper of the clearance portion 62 will urge the substrate 8 radially inwardly to the position of the alignment ridge 64 as it is lifted from the surface of the support member 18. However, the invention specifically contemplates other configurations of the clearance portion 62, including simple recesses, compound recesses having a portion thereof tapered to provide re-alignment of the substrate 8 as it is moved from the support member 18, or other configurations.

Referring still to FIGS. 5 through 8, the alignment member 50 also provides alignment of the substrate 8 on the laminate portion 28 of the electrostatic chuck 30 without substantial risk that the substrate 8 will become adhered to the laminate portion 28 while it is also in contact with the alignment member 50. As discussed supra, the substrate 8 may be warped, or the pins 27 may not position the underside of the substrate 8 parallel to the laminate portion 28 as the substrate 8 is being lowered onto the support member 18. Therefore, one portion of the substrate 8 may be closer to the laminate portion 28 than other portions of the substrate 8. This closer portion of the substrate will be the first portion of the substrate 8 to contact the laminate member, and this portion will become gripped to the laminate portion 28 and thereby fix the position of the substrate 8 on the laminate portion 28 before the remainder of the substrate 8 is sufficiently close to the laminate portion 28 to be gripped thereby. Using the prior art focus ring, the substrate 8 may be simultaneously gripped by the laminate portion 28 at one portion of the substrate 8, while another portion of the substrate 8 is in contact with the focus ring. When this occurs, the portion of the substrate 8 in contact with the focus ring can become jammed in place and never be pulled into contact with the laminate portion 28 of the electrostatic chuck 30. As a result, the portion of the substrate 8 extending from the laminate portion 28 to the focus ring will not be cooled, because the cooling gas intended to be maintained between the substrate and the laminate member at that location will leak directly into the chamber.

The recessed portion 62 of the alignment member 50 ensures that a substrate 8 will not become jammed between the alignment member 50 and the laminate portion 28 because the recessed portion 62 provides a gap 65 between the substrate 8 edge and the alignment member 50 so that simultaneous gripping of the substrate 8 to the laminate portion 28 and contact of the substrate 8 edge with the alignment member 50 cannot occur. To provide this result, the proper height of the recessed portion 62 is determined by calculating, from the warpage tolerance of the wafer, the pin spacing, the flatness tolerance of the laminate portion 28 and the tolerance on the pin 27 height and pin positioning apparatus alignment, the maximum possible distance differential between the point on the underside of the substrate 8 which will first contact the laminate member and the point on the substrate furthest from that point measured along a path perpendicular to the laminate portion 28 surface, and sizing the height of the recessed portion 62 greater than this dimension. Additionally, the taper of the recessed portion 62 must also be determined by considering the warpage of the substrate. If the substrate is warped or if it is dished, i.e., if it has a convex or concave surface, the edge of the substrate 8 will move slightly radially outwardly as the laminate portion 28 pulls the entire surface of the substrate 8 into contact therewith. This may cause the edge of the substrate 8 to move radially outwardly as it is chucked. Typically, where the substrate 8 is warped or dished, the substrate 8 edge will move through an arc, centered on the point of initial contact between the substrate and the laminate member, such that the closer the substrate edge gets to the laminate portion 28, the greater the radial extension of the edge substrate edge. Therefore, the taper of the recessed portion must be such that the substrate edge cannot contact the surface of the recessed portion 62 as the substrate 8 is chucked. By so dimensioning the recessed portion 62, the alignment ridge 64 will be positioned to center the substrate 8 but not interfere with the substrate 8 as it is chucked on the support member 18.

In the embodiment of the invention shown and described in FIGS. 5 through 8, the alignment member 50 is used in a plasma etch apparatus, and it replaces the focus ring which is otherwise used to improve uniformity of the etching of the exposed surface of the substrate 8. However, a focus ring is not always required and may, in some circumstances, contribute to non-uniform etching of the exposed surface of the substrate 8. Additionally, in non-etch processes where an electrostatic chuck or other type of chucking is used to provide the chucking of the substrate 8 to the support member 18, a focus ring may also be unnecessary, or even detrimental to the uniformity of the processing on the exposed surface of the substrate 8.

Figure 9:
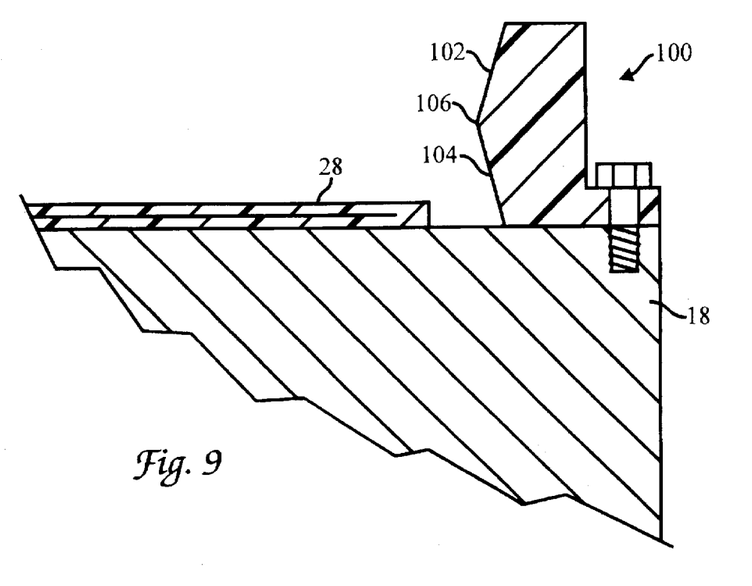
FIG. 9 is a sectional view of the apparatus of FIG. 1, showing an alternative embodiment of the alignment member.
Figure 10:
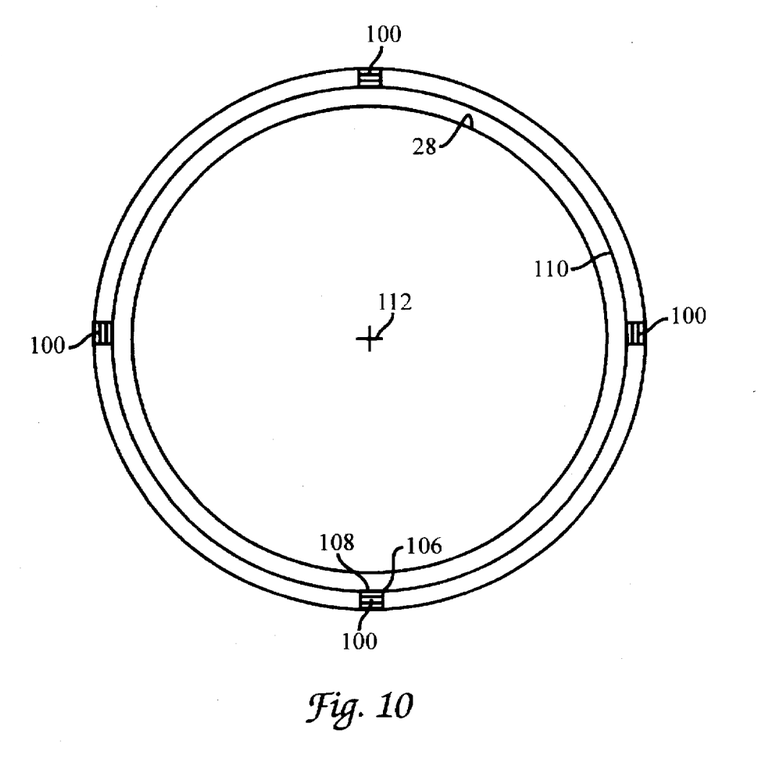
FIG. 10 is a plan view of a substrate positioned on a support member using the alignment member of FIG. 9.

To provide the alignment features of the present invention, without substantially affecting the uniformity of the deposition or etch process, the alignment surfaces may be provided on a plurality, preferably four to six, indexing posts 100 as shown in FIGS. 9 and 10, evenly spaced about the perimeter of the laminate portion 28. Each of the posts 100 includes an upper, inwardly tapered surface 102, a lower, inwardly projecting surface 104, and an alignment ridge 106 provided at the confluence of the upper and lower tapered surfaces 102, 104. As best shown in FIG. 10, the posts 100 are placed at the perimeter of the laminate portion 28, such that the center 108 of each of the alignment ridges 106 are tangent to, and positioned on, a locus or circle 110 centered about the center 112 of the circular laminate portion 28. The circle 110 has a diameter slightly larger than the maximum, within tolerance, diameter of a substrate 8. The upper tapered surface preferably has the same taper, and relative size, as the alignment portion 60 of the alignment member 50, and the lower tapered portion 104 preferably has the same size and taper as the clearance portion 62. Likewise, the ridge 106 is preferably located the same distance from the laminate portion 28 as is the alignment ridge 64 of the alignment member 50. Thus, the plurality of alignment posts 100 will ensure that a substrate 8 will be centered on the laminate portion 28, and that the substrate will not simultaneously contact the alignment post 100 and the laminate portion 28.

Although the alignment members have been described herein as being received on the support member, it is specifically contemplated that the alignment member may be spaced from the support member, or may be positioned above the support member on pins or other supports. Additionally, where the alignment member is spaced from the support member to ensure that the substrate is not contacting the alignment member as it engages the substrate receiving surface, the alignment member may be moved after the substrate is deposited on the support member, and repositioned with respect to the support member after the substrate is removed from the support member. This ensures that the alignment member will not shadow, or otherwise impose uniformities on, the substrate 8 as it is processed.

The alignment member of the present invention provides a simple means of repeatably aligning substrates on a support member, and may be used in preexisting substrate processing chambers with minimal affect on the existing process chamber parameters. Additionally, it has universal application wherever a substrate must be aligned with a support member, particularly where the alignment is necessary because of potential misalignment between the substrate and the substrate handling equipment.

We claim:

1. An apparatus for aligning a substrate on a substrate receiving surface of a support member, the apparatus comprising:
   a substrate positioning member having at least a first position wherein a substrate is positioned on the positioning member and a second position wherein the positioning member deposits the substrate on the support member; and
   at least one alignment member positionable adjacent to the substrate receiving surface of the support member, said alignment member including (i) an inwardly tapered alignment face which is spaced from the substrate receiving surface of the support member and is contactable with the substrate as the positioning member moves from the first position to the second position to urge a misaligned substrate toward a center of the substrate receiving surface, (ii) an outwardly recessed portion between the substrate receiving surface and said alignment face the recessed portion extending outwardly from, and directly adjacent to, the substrate receiving portion, and the recessed portion sized to provide a clearance flap between the substrate and the alignment member, and (iii) a tapered alignment ridge defined by the inwardly tapered alignment face and the outwardly recessed portion, the ridge aligned with an edge of the substrate receiving surface to deposit an aligned substrate on the substrate receiving surface of the support member.

2. The apparatus of claim 1, wherein said alignment member is received on the support member.

3. The apparatus of claim 1, wherein said alignment face is frustroconical.

4. The apparatus of claim 1, wherein said recessed portion is a frustroconical surface.

5. The apparatus of claim 1, wherein said alignment face and said recessed portion intersect at the alignment ridge.

6. The apparatus of claim 1, wherein the said alignment member is a focus ring.

7. The alignment member of claim 1, wherein said alignment member is annular.

8. The apparatus of claim 4, wherein said recessed portion provides a surface to center the substrate as it is removed from the support member.

9. The apparatus of claim 5, wherein said alignment ridge is spaced from the substrate receiving surface of the support member by a distance which exceeds the maximum height of any substrate warpage.

10. The apparatus of claim 1, wherein said substrate receiving surface includes an electrostatic laminate member thereon; and
    said alignment member aligns the edge of the substrate to overhang the edge of the laminate member about the entire circumference of the laminate member.

11. The apparatus of claim 10, wherein said overhanging portion extends a uniform distance past the edge of the laminate member about the circumference of the laminate member.

12. The apparatus of claim 1, wherein said alignment member is a ring.

13. The apparatus of claim 1, wherein said alignment member includes a plurality of individual posts.

14. The apparatus of claim 1, wherein the alignment member comprises at least one of the following:
    (i) a continuous annular ring extending about the periphery of the substrate receiving surface of the support member; or
    (ii) a plurality of individual posts spaced about the periphery of the substrate receiving surface of the support member.

15. A method of aligning a substrate on a substrate receiving surface of a support member, the method comprising the steps of:
    positioning an alignment member adjacent to the substrate receiving surface, the alignment member comprising (i) an inwardly tapered alignment face, and (ii) a recessed portion extending outwardly from, and directly adjacent to, the substrate receiving surface;
    moving the substrate in the direction of the substrate receiving surface; and
    contacting the substrate with the inwardly tapered alignment face of the alignment member as the substrate moves in the direction of the substrate receiving surface such that the substrate is moved with respect to the substrate receiving surface to center and align the substrate with the substrate receiving surface and to provide a clearance gap between the recessed portion on the alignment member and the substrate.

16. The method of claim 15, wherein the inwardly tapered alignment face comprises a frustroconical alignment face for contacting the substrate.

17. The method of claim 16, wherein the recessed portion comprises a frustroconical profile.

18. The method of claim 17, wherein the step of positioning the alignment member comprises positioning the alignment member on the support member.

19. The method of claim 15, including the further step of aligning the substrate with the substrate receiving surface by contacting the edge of the substrate with the recessed portion as the substrate is lifted from the substrate receiving surface.

20. An apparatus for promoting the placement of a substrate concentrically and in face to face contact with a generally circular substrate support location surface comprising:

a plurality of members arranged about a circular locus concentric about said support location surface, and extending upwardly from said support location surface, each of said members having a top surface and a bottom surface;

said members defining an intermediate inner diameter between said top and bottom surfaces, said intermediate inner diameter being larger than the diameter of said substrate, said intermediate inner diameter being the smallest inner diameter of said member;

said members defining a topmost inner diameter which is larger than said intermediate inner diameter, said members each defining an inner surface which smoothly transitions from said topmost diameter to said intermediate diameter, so that a substrate tends to become centered as the substrate is passed along the inner surface of said members;

said members also defining a lowermost inner diameter which is larger than said intermediate diameter for the spacing of a centered substrate from said inner surface when the substrate is in a rest position upon said support location surface, to ensure that the substrate is received upon said support location surface in face-to-face contact therewith and does not become jammed in another position while passing along the inner surface of the members.

21. The apparatus of claim 20, wherein said plurality of members comprises at least three members equally spaced about said substrate support location surface.

22. The apparatus of claim 20, wherein said plurality of members comprise sections of a cylinder coinciding with said locus.

23. The apparatus of claim 22, wherein said plurality of members define a unitary generally cylindrical sleeve coinciding with said locus.

24. The apparatus of claim 20, wherein said inner surface of said members tapers smoothly between said top, intermediate, and bottom inner diameters.

25. An apparatus for aligning a substrate on a receiving surface of a support, the apparatus comprising one or more alignment members positioned circumferentially about the receiving surface of the support, the alignment members comprising:

(a) an alignment face tapered inwardly toward the receiving surface of the support to center a misaligned substrate on the receiving surface when the substrate is deposited on the alignment face, the alignment face having (i) a topmost inner diameter sized to receive a misaligned substrate, and (ii) an intermediate inner diameter sized to center the misaligned substrate on the receiving surface of the support; and (b) a recessed portion extending outwardly from, and directly adjacent to, the receiving surface of the support, the recessed portion comprising a lowermost inner diameter sized (i) larger than the intermediate inner diameter of the alignment face, and (ii) sufficiently larger than the substrate to provide a clearance gap for the substrate.

26. The apparatus of claim 25, wherein the alignment face comprises a frustroconical surface.

27. The apparatus of claim 25, wherein the recessed portion comprises a frustroconical surface.

28. The apparatus of claim 25, wherein the alignment members comprise an alignment ridge between the alignment face and the recessed portion, the alignment ridge aligned with an edge of the receiving surface.

29. The apparatus of claim 25, wherein the alignment members comprise an alignment ridge spaced from the substrate receiving surface of the support by a distance which exceeds a maximum substrate warpage height.

30. The apparatus of claim 25, wherein the alignment members comprise at least one continuous annular ring.

31. The apparatus of claim 25, wherein the alignment members comprise a plurality of individual posts.

32. A method of using the apparatus of claim 25, comprising the step of placing a misaligned substrate on the alignment face of the alignment member to cause the substrate to be urged toward the center of the receiving surface of the support.

33. An apparatus for aligning a substrate on a receiving surface, the apparatus comprising at least one substantially continuous annular ring positioned circumferentially about the receiving surface, the annular ring comprising:

(a) an alignment face tapered inwardly toward the receiving surface, the alignment face having (i) a topmost inner diameter sized to receive a misaligned substrate, and (ii) an intermediate inner diameter sized smaller than the topmost inner diameter to urge a misaligned substrate deposited on the alignment face toward the center of the receiving surface; and (b) a recessed portion extending outwardly from, and in substantially the same plane as, the receiving surface, the recessed portion comprising an inner diameter sized larger than the substrate to provide a clearance gap for the substrate when the substrate rests on the receiving surface.

34. The apparatus of claim 33, wherein the alignment face comprises a frustroconical surface.

35. The apparatus of claim 33, wherein the recessed portion comprises a frustroconical surface.

36. The apparatus of claim 33, wherein the annular ring comprises an alignment ridge between the alignment face and the recessed portion, the alignment ridge aligned with an edge of the receiving surface.

37. The apparatus of claim 36, wherein the alignment ridge is spaced from the receiving surface by a distance which exceeds a maximum substrate warpage height.

38. An alignment apparatus for aligning a substrate on a receiving surface, the apparatus comprising a plurality of individual posts positioned circumferentially about a receiving surface, each of the posts comprising:

(a) an alignment face tapered inwardly toward the receiving surface, the alignment face having (i) a topmost inner diameter sized to receive a misaligned substrate, and (ii) an intermediate inner diameter sized to urge a misaligned substrate deposited on the alignment face toward the center of the receiving surface; and (b) a recessed portion extending outwardly from, and in substantially the same plane as, the receiving surface, the recessed portion comprising a lowermost inner diameter sized larger than the substrate to provide a clearance gap for the substrate when the substrate rests on the receiving surface.

39. The apparatus of claim 38, wherein the alignment face comprises a frustroconical surface.

40. The apparatus of claim 38, wherein the recessed portion comprises a frustroconical surface.

41. The apparatus of claim 38, wherein each post comprises an alignment ridge between the alignment face and the recessed portion, the alignment ridge aligned with an edge of the receiving surface.

42. The apparatus of claim 38, wherein the alignment ridge is spaced from the receiving surface by a distance exceeding the maximum substrate warpage height.

* * * * *